US010325725B2

(12) United States Patent
Seo et al.

(10) Patent No.: US 10,325,725 B2
(45) Date of Patent: Jun. 18, 2019

(54) MULTILAYER CAPACITOR AND BOARD HAVING THE SAME

(71) Applicant: SAMSUNG ELECTRO-MECHANICS CO., LTD., Suwon-si, Gyeonggi-do (KR)

(72) Inventors: Yong Won Seo, Gyeonggi-do (KR); Jin Kyung Joo, Gyeonggi-do (KR); Ik Hwan Chang, Gyeonggi-do (KR); Jin Woo Chun, Gyeonggi-do (KR); Jin Man Jung, Gyeonggi-do (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/495,121

(22) Filed: Apr. 24, 2017

(65) Prior Publication Data
US 2018/0068796 A1    Mar. 8, 2018

(30) Foreign Application Priority Data

Sep. 6, 2016  (KR) .................. 10-2016-0114616

(51) Int. Cl.
*H01G 4/008* (2006.01)
*H01G 4/12* (2006.01)
(Continued)

(52) U.S. Cl.
CPC .............. *H01G 4/30* (2013.01); *H01G 4/005* (2013.01); *H01G 4/008* (2013.01); *H01G 4/228* (2013.01);
(Continued)

(58) Field of Classification Search
CPC .......... H01G 4/005; H01G 4/008; H01G 4/12; H01G 4/228; H01G 4/232; H01G 4/236;
(Continued)

(56) References Cited

U.S. PATENT DOCUMENTS 10,026,558 B1 *  7/2018  Lee .......................... H01G 4/30
10,076,036 B2 *  9/2018  Lee ......................... H01G 4/012
(Continued)

FOREIGN PATENT DOCUMENTS

JP        2013-26392 A       2/2013
KR        10-0465845 B1      1/2005
(Continued)

*Primary Examiner* — Timothy J Thompson
*Assistant Examiner* — Guillermo J Egoavil
(74) *Attorney, Agent, or Firm* — Morgan Lewis & Bockius LLP

(57) ABSTRACT

A multilayer capacitor includes a capacitor body including a plurality of first and second internal electrodes alternately stacked with dielectric layers interposed therebetween. A first via electrode penetrates through the plurality of first internal electrodes and is exposed at the first surface of the capacitor body. A second via electrode penetrates through the plurality of second internal electrodes, is exposed at the first surface of the capacitor body, and is spaced apart from the first via electrode. First and second external electrodes are on a first surface of the capacitor body, spaced apart from each other, and respectively connected to end portions of the first and second via electrodes. The first and second external electrodes each include a nickel (Ni) layer on the first surface of the capacitor body and a gold (Au) plating layer on the nickel layer.

12 Claims, 8 Drawing Sheets

(51) Int. Cl.
  *H01G 4/232* (2006.01)
  *H01G 4/30* (2006.01)
  *H01K 1/18* (2006.01)
  *H05K 1/11* (2006.01)
  *H05K 1/18* (2006.01)
  *H01G 4/005* (2006.01)
  *H01G 4/228* (2006.01)

(52) U.S. Cl.
  CPC ............. *H01G 4/232* (2013.01); *H05K 1/111* (2013.01); *H05K 1/181* (2013.01); *H01G 4/12* (2013.01); *H05K 2201/10015* (2013.01)

(58) Field of Classification Search
  CPC ... H01G 4/30; H05K 1/11; H05K 1/18; H05K 1/111; H05K 1/181; H05K 1/185; H05K 2201/10015; H05K 2203/1469; H01L 23/49822; H01L 23/50; H01L 2924/0002
  USPC .......................................... 174/260; 361/32.1
  See application file for complete search history.

(56) References Cited

U.S. PATENT DOCUMENTS

| | | | |
|---|---|---|---|
| 2003/0151141 A1* | 8/2003 | Matsuki | H01L 23/49811 257/746 |
| 2005/0269287 A1* | 12/2005 | Tsujimura | H01G 2/065 216/13 |
| 2010/0059257 A1 | 3/2010 | Choi et al. | |
| 2012/0018204 A1* | 1/2012 | Sato | H01G 4/232 174/260 |
| 2013/0020913 A1 | 1/2013 | Shirakawa et al. | |
| 2015/0380167 A1 | 12/2015 | Lim et al. | |
| 2017/0278635 A1* | 9/2017 | Mizuno | H01G 4/005 |

FOREIGN PATENT DOCUMENTS

| | | |
|---|---|---|
| KR | 10-2010-0028915 A | 3/2010 |
| KR | 10-2016-0000753 A | 1/2016 |

* cited by examiner

MULTILAYER CAPACITOR AND BOARD HAVING THE SAME

CROSS-REFERENCE TO RELATED APPLICATION(S)

This application claims benefit of priority to Korean Patent Application No. 10-2016-0114616, filed on Sep. 6, 2016 in the Korean Intellectual Property Office, the disclosure of which is incorporated herein by reference in its entirety.

BACKGROUND

1. Field

The present disclosure relates to a multilayer capacitor and a board having the same.

2. Description of Related Art

A multilayer capacitor, one of a variety of multilayer electronic components, is mounted on a circuit board of several electronic products, such as an image device, a liquid crystal display (LCD), a plasma display panel (PDP), a computer, a personal digital assistant (PDA), a cellular phone, and the like, to serve to charge or discharge electricity therein or therefrom.

The multilayer capacitor described above may be used in various electronic apparatuses, due to advantages such as a small size, a high capacitance, and ease of mounting.

Recent trends of wearable devices and mobile devices necessitate miniaturization, high specification, and high performance, such that circuit elements should be mounted on a board at a high density.

In a multilayer capacitor according to the related art, tin (Sn) plating layers formed on both sides of the multilayer capacitor and solder of a board are bound to each other, to mount the multilayer capacitor on the board. The length of a fillet, a binding layer of the tin plating layer and the solder, adds to the length of the multilayer capacitor, such that the entire size is increased.

The fillet does not influence electrical characteristics of the multilayer capacitor. In the related art, the fillet is not formed, which is advantageous in view of high-density mounting in the board.

Therefore, a multilayer capacitor having a lower surface electrode structure, in which soldering is performed on a lower surface of the multilayer capacitor, has been disclosed.

However, manufacturing the multilayer capacitor having the lower surface electrode structure according to the related art involves printing and stacking a nickel electrode on a cover layer in the stacking direction and printing a nickel electrode on a compressed bar.

The nickel electrode printed as described above is sintered simultaneously with ceramics of a capacitor body. In order to secure solderability, plating is performed.

When using a nickel or tin plating method according to the related art, binding force between the nickel electrode and plated nickel is not secured, such that a peel off defect may occur when soldering.

SUMMARY

An aspect of the present disclosure may provide a multilayer capacitor capable of implementing high-density mounting of elements in a board and securing solderability at when mounting the multilayer capacitor on a circuit board, and a board having the same.

According to an aspect of the present disclosure, a multilayer capacitor may include: a capacitor body including a plurality of first and second internal electrodes alternately stacked with dielectric layers interposed therebetween. A first via electrode penetrates through the plurality of first internal electrodes and is exposed at the first surface of the capacitor body. A second via electrode penetrates through the plurality of second internal electrodes, is exposed at the first surface of the capacitor body, and is spaced apart from the first via electrode. First and second external electrodes are on a first surface of the capacitor body, spaced apart from each other, and respectively connected to end portions of the first and second via electrodes. The first and second external electrodes each include a nickel (Ni) layer on the first surface of the capacitor body and a gold (Au) plating layer on the nickel layer.

According to another aspect of the present disclosure, a multilayer capacitor may include: a capacitor body including a plurality of first and second internal electrodes alternately stacked with dielectric layers interposed therebetween. A first via electrode penetrates through the plurality of first internal electrodes and is exposed at a first surface of the capacitor body. A second via electrode penetrates through the plurality of second internal electrodes, is exposed at the first surface of the capacitor body, and is spaced apart from the first via electrode. First and second external electrodes are on the first surface of the capacitor body, spaced apart from each other, and respectively connected to end portions of the first and second via electrodes. The first and second external electrodes each include a nickel (Ni) layer on the first surface of the capacitor body, a copper (Cu) plating layer on the nickel layer, and a nickel-tin (Ni—Sn) plating layer on the copper plating layer.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
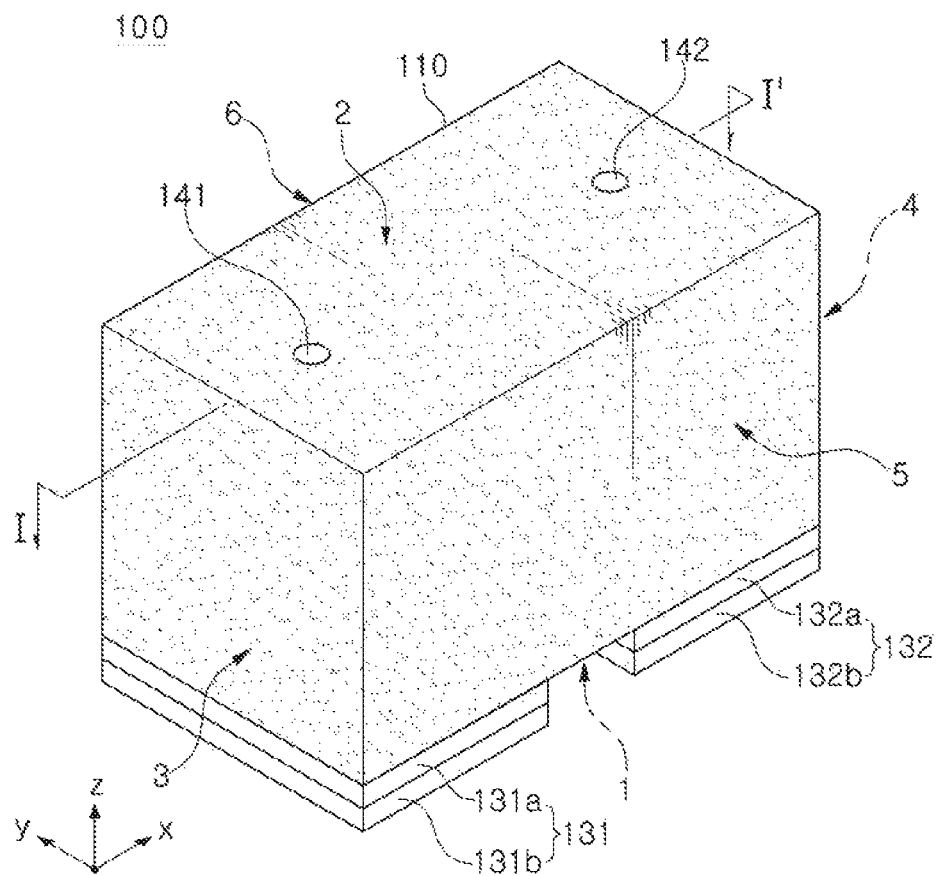
FIG. 1 is a perspective view schematically illustrating a multilayer capacitor according to an exemplary embodiment in the present disclosure.

Hereinafter, exemplary embodiments in the present disclosure will now be described in detail with reference to the accompanying drawings.

Directions of a capacitor body will be defined in order to clearly describe exemplary embodiments in the present disclosure. X, Y, and Z illustrated in the accompanying drawings refer to a length direction, a width direction, and a thickness direction of the capacitor body, respectively. In the present exemplary embodiment, the thickness direction may be the same as a stacking direction in which dielectric layers and internal electrodes are stacked.

In the present exemplary embodiment, for convenience of explanation, both surfaces of a capacitor body 110 opposing each other in the Z direction will be defined as first and second surfaces 1 and 2, both surfaces of the capacitor body 110 opposing each other in the X direction and connecting the first and second surfaces 1 and 2 to each other will be defined as third and fourth surfaces 3 and 4, and both surfaces of the capacitor body 110 opposing each other in the Y direction and connecting the first and second surfaces 1 and 2 to each other and connecting the third and fourth surfaces 3 and 4 to each other will be defined as fifth and sixth surfaces 5 and 6.

Hereinafter, the first surface 1 may be the same as a mounting surface.

Multilayer Capacitor

Figure 2:
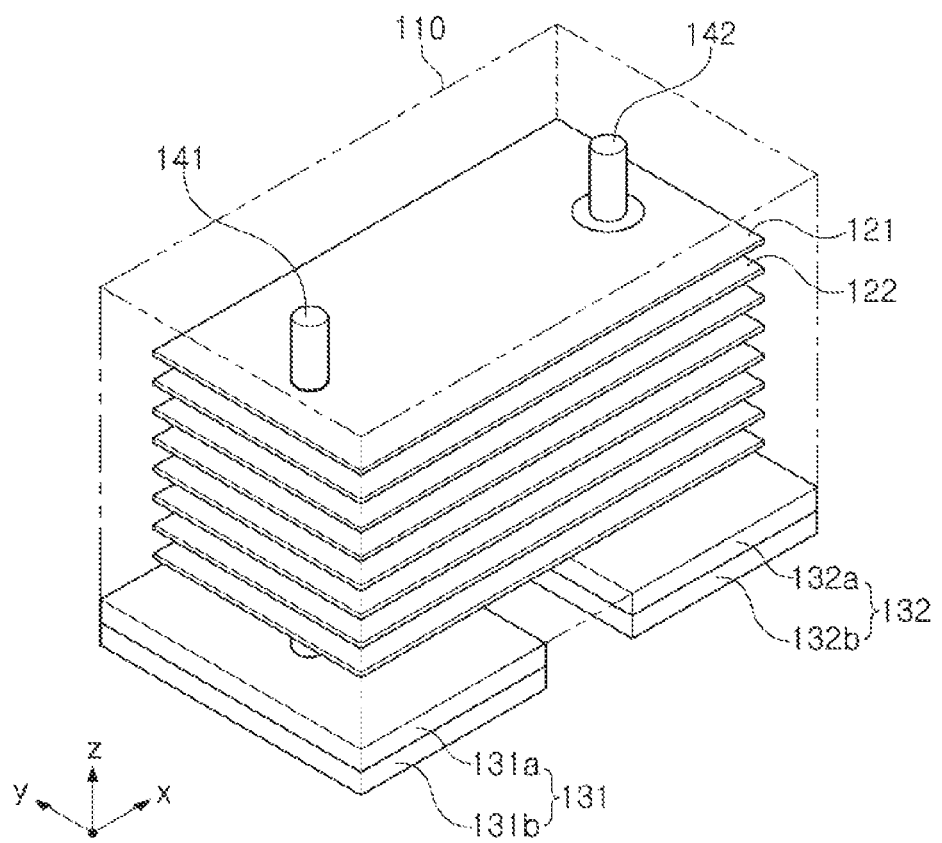
FIG. 2 is a transparent perspective view of FIG. 1.
Figure 3A:
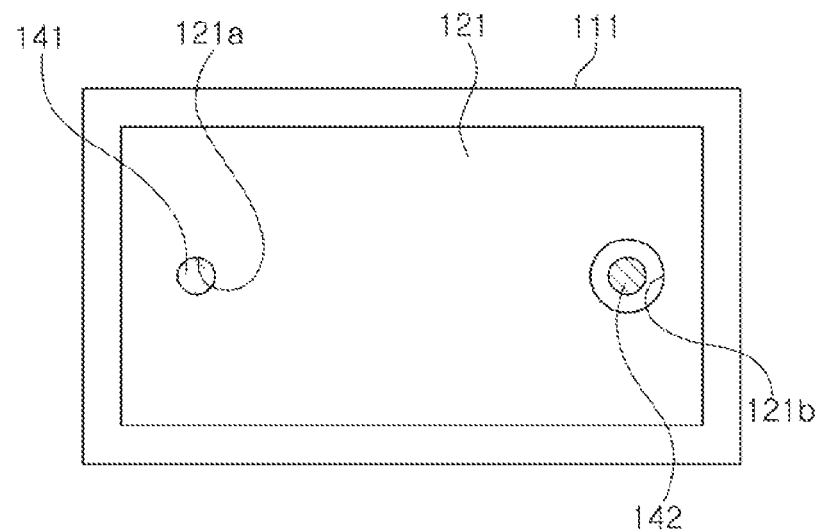
FIGS. 3A and 3B are plan views illustrating structures of first and second internal electrodes in the multilayer capacitor according to the exemplary embodiment in the present disclosure, respectively.
Figure 3B:
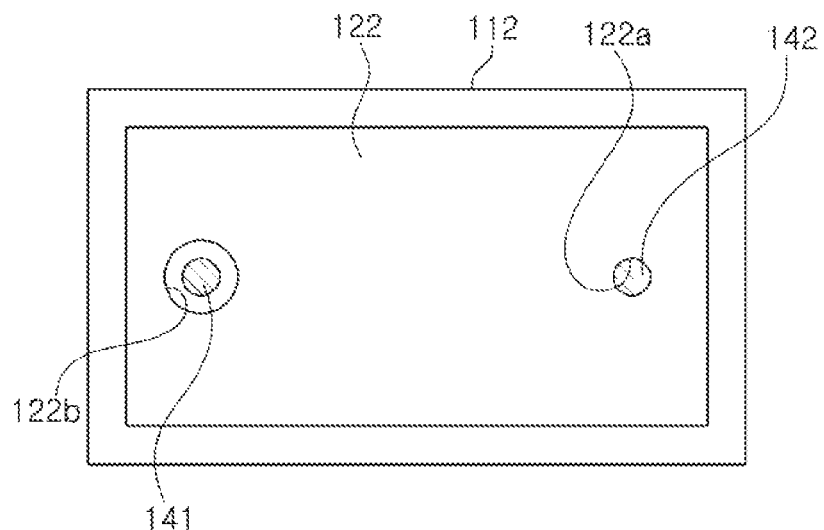
Figure 4:
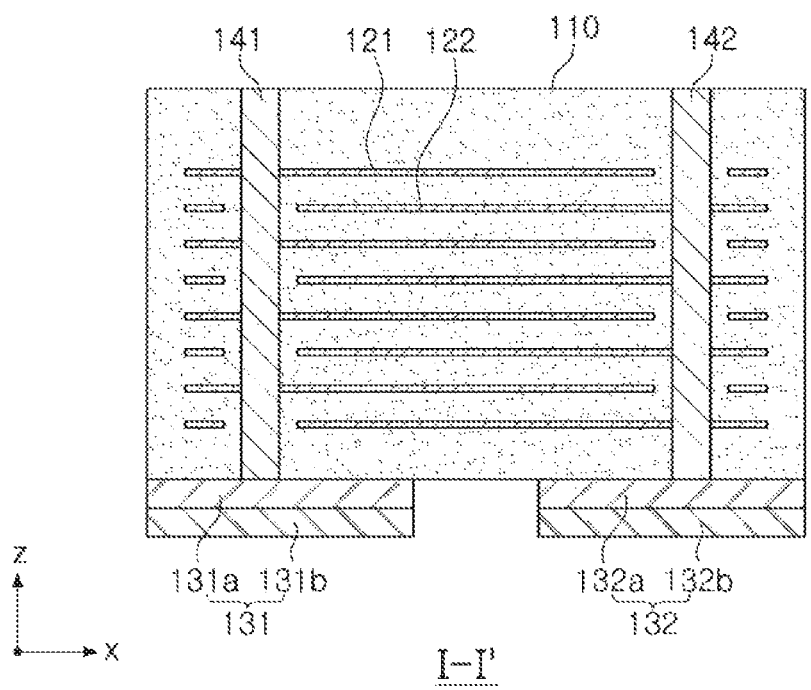
FIG. 4 is a cross-sectional view taken along line I-I' of FIG. 1.

FIG. 1 is a perspective view schematically illustrating a multilayer capacitor according to an exemplary embodiment in the present disclosure. FIG. 2 is a transparent perspective view of FIG. 1. FIGS. 3A and 3B are plan views illustrating structures of first and second internal electrodes in the multilayer capacitor according to the exemplary embodiment in the present disclosure, respectively. FIG. 4 is a cross-sectional view taken along line I-I' of FIG. 1.

Referring to FIGS. 1 through 4, a multilayer capacitor 100 according to the exemplary embodiment in the present disclosure may include a capacitor body 110 including a plurality of dielectric layers 111 and 112, a plurality of first and second internal electrodes 121 and 122, and first and second via electrodes 141 and 142. and the multilayer capacitor 100 may include first and second external electrodes 131 and 132.

The first via electrode 141 may penetrate through the plurality of first internal electrodes 121 in the Z direction, such that a lower end portion thereof may be exposed at the first surface 1 of the capacitor body 110.

The second via electrode 142 may penetrate through the plurality of second internal electrodes 122 in the Z direction to thereby be exposed at the first surface 1 of the capacitor body 110 at a lower end portion thereof, and may be spaced apart from the first via electrode 141 in the X direction of the capacitor body 110.

The capacitor body 110 may be formed by stacking a plurality of dielectric layers 111 and 112 in the Z direction, and may have a substantially hexahedral shape as illustrated in FIG. 1, but is not particularly limited thereto.

The shape and dimensions of the capacitor body 110 and the number of stacked dielectric layers 111 and 112 are not limited to those illustrated in the accompanying drawings.

The dielectric layers 111 and 112 may be in a sintered state, and adjacent dielectric layers 111 and 112 may be integrated with each other so that boundaries therebetween are not readily apparent without a scanning electron microscope (SEM).

The capacitor body 110 as described above may include an active region, including the first and second internal electrodes 121 and 122 as a part contributing to forming capacitance of the capacitor, and cover regions disposed on upper and lower surfaces of the active region in the Z direction, respectively, as margin parts.

The active region may be formed by repeatedly stacking the plurality of first and second internal electrodes 121 and 122 with dielectric layers 111 and 112 interposed therebetween.

The thicknesses of the dielectric layers 111 and 112 may be selected depending on the capacitance design of the multilayer capacitor 100.

The dielectric layers 111 and 112 may contain ceramic powders having high permittivity, for example, barium titanate ($BaTiO_3$) based powders or strontium titanate ($SrTiO_3$) based powders. However, the material of the dielectric layers 111 and 112 is not limited thereto.

If necessary, the dielectric layers 111 and 112 may further contain at least one of ceramic additives, organic solvents, plasticizers, binders, dispersants, and the like, in addition to the ceramic powders.

The cover regions may be formed of the same material as that of the dielectric layers 111 and 112 and have the same configuration as that of the dielectric layers 111 and 112 and differ by being positioned in upper and lower portions of the capacitor body 110 in the Z direction and not including internal electrodes.

The cover regions may be prepared by stacking a one or more dielectric layers 111 and 112 on the upper and lower surfaces of the active region in the Z direction, respectively, and may serve to prevent the first and second internal electrodes 121 and 122 from being damaged by physical or chemical stress.

The first and second internal electrodes 121 and 122 may be electrodes having different polarities from each other.

The first and second internal electrodes 121 and 122 may be alternately stacked in the ceramic body 110 in the Z direction with respective dielectric layers 111 and 112 interposed therebetween.

The overlapping area between the first and second internal electrodes 121 and 122 in the Z direction is associated with capacitance of the capacitor.

The first and second internal electrodes 121 and 122 may be spaced apart from the third to sixth surfaces of the capacitor body 110.

Therefore, cracks and delamination mainly occurring in edges or corners of the capacitor body 110 may be prevented.

The first and second internal electrodes 121 and 122 may be formed by printing a conductive paste containing a conductive metal on the dielectric layers 111 and 112 at a predetermined thickness, and insulated from each other by each of the dielectric layers 111 and 112 interposed therebetween.

The conductive metal contained in the conductive paste may be, for example, nickel (Ni), copper (Cu), palladium (Pd), or an alloy thereof. However, the conductive metal contained in the conductive paste is not limited thereto.

The conductive paste may be printed by a screen printing method, a gravure printing method, or the like. However, the method of printing the conductive paste is not limited thereto.

According to the exemplary embodiment, the capacitor body 110 may include first and second via holes 121a and 122a.

The first and second via holes 121a and 122a may be formed by a laser punching or mechanical punching method.

The first and second via holes 121a and 122a may be formed in the Z direction, which is a stacking direction of the dielectric layers 111 and 112, so that the first and second internal electrodes 121 and 122 are partially removed.

The first and second via holes 121a and 122a are illustrated and described as having a circular shape in the present exemplary embodiment.

However, the shape of the first and second via holes 121a and 122a is not limited thereto, and if necessary, the first and second via holes 121a and 122a may have various shapes such as semi-circles, quadrangles, triangles, and the like.

The first and second via electrodes 141 and 142 elongated in the Z direction may be formed by filling a conductive material in the first and second via holes 121a and 122a or castellation.

A first via separation hole 121b may be formed in the first internal electrode 121 at a position corresponding to the second via hole 122a to be larger than the second via hole 122a.

Therefore, the first via electrode 141 may contact the first via hole 121a to electrically connect the plurality of first internal electrodes 121 stacked in the Z direction to each other.

The second via electrode 142 may be spaced apart from the first internal electrode 121 by the first via separation hole 121b, such that the second via electrode 142 may not be electrically connected to the first internal electrode 121.

A second via separation hole 122b may be formed in the second internal electrode 122 at a position corresponding to the first via hole 121a to be larger than the first via hole 121a.

Therefore, the second via electrode 142 may contact the second via hole 122a to electrically connect the plurality of the second internal electrodes 122 stacked in the Z direction to each other.

The first via electrode 141 may be spaced apart from the second internal electrode 122 by the second via separation hole 122b, such that the first via electrode 141 may not be electrically connected to the second internal electrode 122.

The first and second external electrodes 131 and 132 may be on the first surface 1 of the capacitor body 110 to be spaced apart from each other in the X direction.

End portions of each of the first and second via electrodes 141 and 142 exposed at the first surface 1 of the capacitor body 110 may be respectively connected to the first and second external electrodes 131 and 132 on the first surface 1 of the capacitor body 110.

The first and second external electrodes 131 and 132 as described above may include nickel (Ni) layers 131a and 132a and gold (Au) plating layers 131b and 132b.

The nickel layers 131a and 132a may be formed on the first surface 1 of the capacitor body 110, and the gold plating layers 131b and 132b may be formed on the nickel layers 131a and 132a by a nickel-gold displacement plating method.

The gold plating layers 131b and 132b may be formed at a thickness of 100 nm or more to secure a predetermined level of binding force with the nickel layers 131a and 132a.

The gold plating layers may be formed using one of an electroplating method, an electroless plating method, or a sputtering method.

The other end portions of the first and second via electrodes 141 and 142 may be exposed to the second surface 2 of the capacitor body 110.

In this case, if necessary, the first and second external electrodes may be additionally disposed on the second surface of the capacitor body and spaced apart from each other.

Therefore, the other end portions of the first and second via electrodes exposed to the second surface of the capacitor body may be respectively connected to the first and second external electrodes disposed on the second surface of the capacitor body.

When internal electrodes are electrically connected to external electrodes formed on amounting surface of a capacitor body through via electrodes formed in a stacking direction of dielectric layers as described above, an overlapping area between the internal electrodes having different polarities may be increased, such that the capacitance may be increased at the same size without thinning the dielectric layers and internal electrodes, to increase the number of stacked dielectric layers, or increasing permittivity.

The multilayer capacitor according to the present exemplary embodiment may be easily applied at the time of manufacturing a product in which a thickness of a capacitor body is 80 μm or less.

Since the external electrodes are only on the mounting surface of the body, when mounting the multilayer capacitor on a circuit board, the contact area with an electrode pad may be decreased, such that the mounting area may be decreased.

Since fillet is not formed between the external electrodes and the circuit board, acoustic noise may be decreased.

Figure 5:
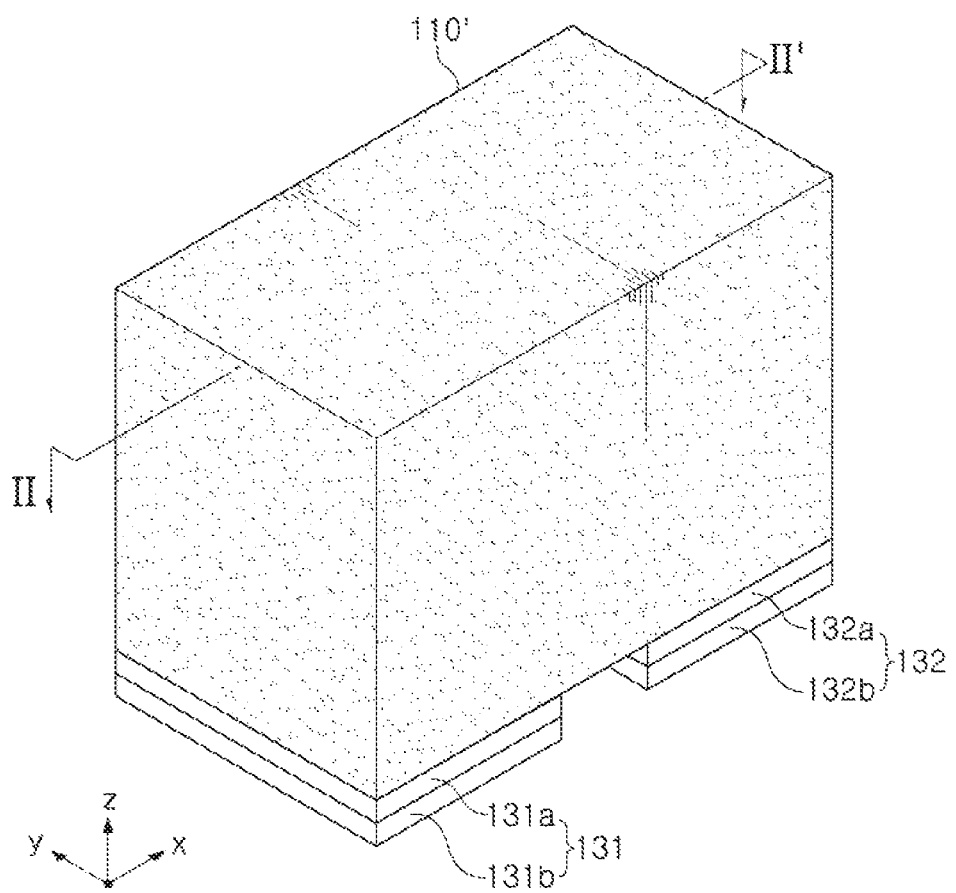
FIG. 5 is a perspective view schematically illustrating a multilayer capacitor according to another exemplary embodiment in the present disclosure.
Figure 6:
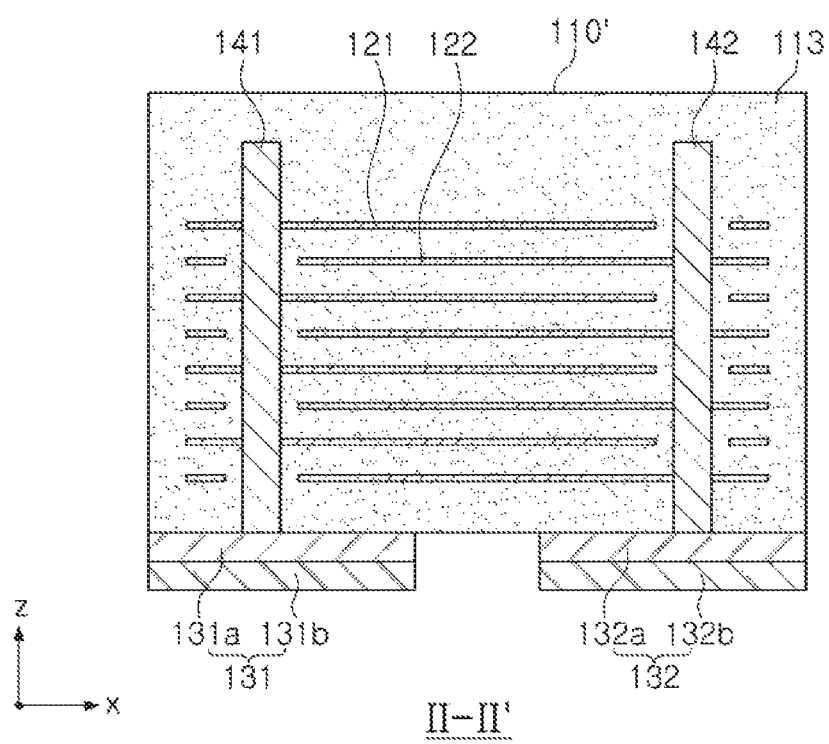
FIG. 6 is a cross-sectional view taken along line II-II' of FIG. 5.

FIG. 5 is a perspective view schematically illustrating a multilayer capacitor according to another exemplary embodiment in the present disclosure. FIG. 6 is a cross-sectional view taken along line II-II' of FIG. 5.

Structures of first and second internal electrodes, first and second external electrodes, and first and second via electrodes are similar to those in the exemplary embodiment described above, and an overlapping description thereof will be omitted.

Referring to FIGS. 5 and 6, a cover 113 may be disposed on a second surface 2 of a capacitor body 110'.

The cover 113 may be formed of the same material as that of the dielectric layers 111 and 112 and may have the same configuration as that of the dielectric layers 111 and 112 and may differ by the cover 113 not including internal electrodes and the via electrode not penetrating through the cover 113.

The cover 113 may be prepared by stacking one or more dielectric layers 111 and 112 on the first surface 1 of the capacitor body 110', and may serve to prevent the first and second via electrodes 141 and 142 from being damaged by physical or chemical stress.

Figure 7:
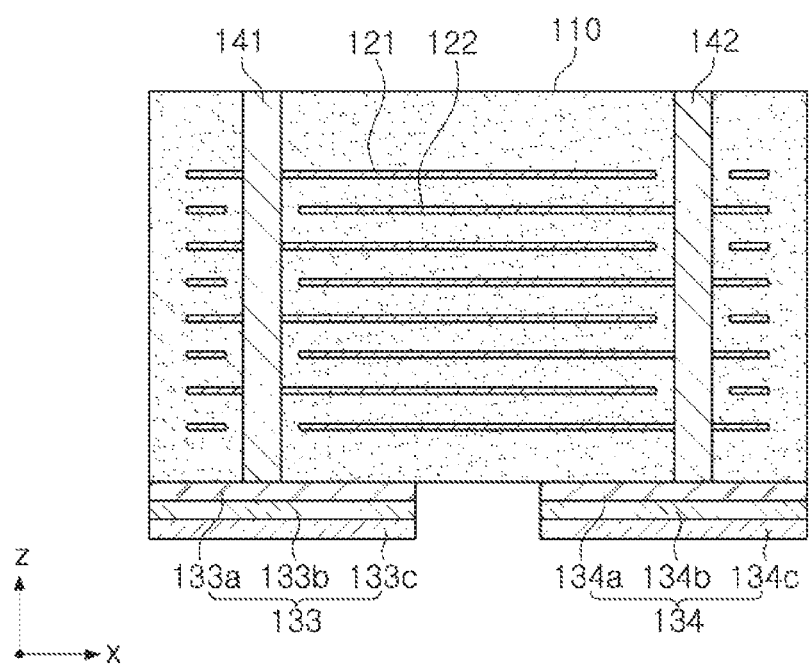
FIG. 7 is a cross-sectional view illustrating another example of external electrodes in the multilayer capacitor according to the present disclosure.

Referring to FIG. 7, first and second external electrodes 133 and 134 may include nickel (Ni) layers 133a and 134a and plating layers, wherein the plating layers may include copper (Cu) plating layers 133b and 134b and nickel-tin (Ni—Sn) plating layers 133c and 134c.

The nickel layers 133a and 134a may be formed on a first surface 1 of a capacitor body 110, the copper (Cu) plating layers 133b and 134b may be formed on the nickel layers 133a and 134a, and the nickel-tin (Ni—Sn) plating layers 133c and 134c may be formed on the copper plating layers 133b and 134b.

The copper plating layers 133b and 133b may be formed at a thickness of 1 μm or more to secure a predetermined level of binding force with the nickel layers 131a and 132a.

Board Having Multilayer Capacitor

Figure 8:
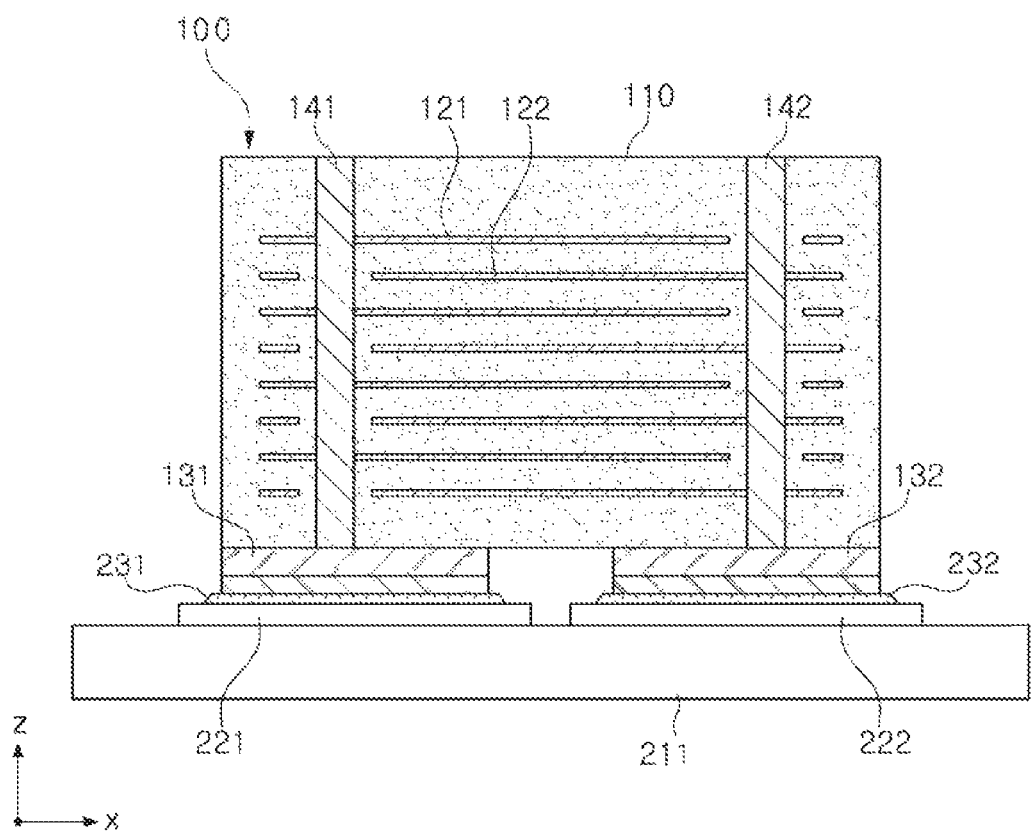
FIG. 8 is a cross-sectional view illustrating the capacitor of FIG. 4 mounted on a circuit board.

Referring to FIG. 8, a board having a multilayer capacitor according to the present exemplary embodiment may include a circuit board 211 on which the multilayer capacitor 100 is mounted, and first and second electrode pads 221 and 222 on an upper surface of the circuit board 211 and spaced apart from each other in the X direction.

The multilayer capacitor 100 may be fixed and electrically connected to the circuit board 211 by solder 231 and 232, with the first and second external electrodes 131 and 132 positioned to contact the first and second electrode pads 221 and 222, respectively.

As set forth above, according to exemplary embodiments in the present disclosure, the multilayer capacitor may have a lower surface electrode structure, such that elements may be mounted at a high density in the board, and the plating layers of the external electrodes may include the nickel-tin plating layers formed on the gold plating layers or copper plating layers, such that when mounting the multilayer capacitor on the circuit board, solderability may be secured.

While exemplary embodiments have been shown and described above, it will be apparent to those skilled in the art that modifications and variations could be made without departing from the scope of the present invention as defined by the appended claims.

What is claimed is:

1. A multilayer capacitor comprising:
a capacitor body including a plurality of first and second internal electrodes alternately stacked with dielectric layers interposed therebetween, and having first and second surfaces opposing each other, third and fourth surfaces connected to the first and second surfaces and opposing each other, and fifth and sixth surfaces connected to the first and second surfaces and the third and fourth surfaces and opposing each other;
a first via electrode penetrating through the plurality of first internal electrodes and exposed at the first surface of the capacitor body;
a second via electrode penetrating through the plurality of second internal electrodes, exposed at the first surface of the capacitor body, and spaced apart from the first via electrode;
first and second external electrodes on the first surface of the capacitor body, spaced apart from each other, and respectively connected to end portions of the first and second via electrodes; and
a cover layer at a second surface opposing the first surface of the capacitor body and covering end portions of the first and second via electrodes,
wherein the first internal electrodes each have a first via hole and a first via separation hole, such that the first internal electrodes contact the first via electrode and are spaced apart from the second via electrode,
wherein the second internal electrodes each have a second via hole and a second via separation hole, such that the second internal electrodes contact the second via electrode and are spaced apart from the first via electrode, and
wherein the first internal electrodes have a length and width that are substantially the same as those of the second internal electrodes.

2. The multilayer capacitor of claim 1, wherein the first and second internal electrodes are stacked in a stacking direction perpendicular to the first surface of the capacitor body and spaced apart from surfaces of the capacitor body parallel to the stacking direction.

3. The multilayer capacitor of claim 1, wherein the first and second via electrodes are exposed at the second surface of the capacitor body.

4. A board having a multilayer capacitor, the board comprising:
a circuit board with first and second electrode pads on the surface thereof and spaced apart from each other; and
the multilayer capacitor of claim 1, mounted on the circuit board so that the first and second external electrodes are respectively connected to the first and second electrode pads.

5. The multilayer capacitor of claim 1, wherein the first and second external electrodes each include a first layer consisting essentially of nickel (Ni) and directly on the first surface of the capacitor body, and a second layer consisting essentially of gold (Au) and directly on the first layer.

6. The multilayer capacitor of claim 1, wherein the first and second external electrodes each consist essentially of a first layer including nickel (Ni) and on the first surface of the capacitor body, and a second layer including gold (Au) on the first layer.

7. The multilayer capacitor of claim 1, wherein the first and second internal electrodes substantially overlap with each other in a stacking direction of the capacitor body.

8. A multilayer capacitor comprising:
a capacitor body including a plurality of first and second internal electrodes alternately stacked with dielectric layers interposed therebetween, and having first and second surfaces opposing each other, third and fourth surfaces connected to the first and second surfaces and opposing each other, and fifth and sixth surfaces connected to the first and second surfaces and the third and fourth surfaces and opposing each other;
a first via electrode penetrating through the plurality of first internal electrodes and exposed at the first surface of the capacitor body;
a second via electrode penetrating through the plurality of second internal electrodes, exposed at the first surface of the capacitor body, and spaced apart from the first via electrode;
first and second external electrodes on the first surface of the capacitor body, spaced apart from each other, and respectively connected to end portions of the first and second via electrodes; and
a cover layer at the second surface opposing the first surface of the capacitor body and covering end portions of the first and second via electrodes,
wherein the first internal electrodes each have a first via hole and a first via separation hole, such that the first internal electrodes contact the first via electrode and are spaced apart from the second via electrode,
wherein the second internal electrodes each have a second via hole and a second via separation hole, such that the second internal electrodes contact the second via electrode and are spaced apart from the first via electrode,
wherein the first internal electrodes have a length and width that are substantially the same as those of the second internal electrodes, and
wherein the first and second external electrodes each include a first layer consisting essentially of nickel (Ni) and on the first surface of the capacitor body, a second layer consisting essentially of copper (Cu) and on the first layer, and a third layer consisting essentially of nickel and tin (Ni—Sn) and on the second layer.

9. The multilayer capacitor of claim 8, wherein the first and second internal electrodes are stacked in a stacking direction perpendicular to the first surface of the capacitor body and spaced apart from surfaces of the capacitor body parallel to the stacking direction.

10. The multilayer capacitor of claim 8, wherein the first and second via electrodes are exposed at the second surface of the capacitor body.

11. A board having a multilayer capacitor, the board comprising:

a circuit board with first and second electrode pads on the surface thereof and spaced apart from each other; and the multilayer capacitor of claim 8, mounted on the circuit board so that the first and second external electrodes are respectively connected to the first and second electrode pads.

12. The multilayer capacitor of claim 8, wherein the first and second internal electrodes substantially overlap with each other in a stacking direction of the capacitor body.

* * * * *